United States Patent
Yu et al.

(10) Patent No.: US 8,363,993 B2
(45) Date of Patent: Jan. 29, 2013

(54) COMBINED OPTICAL AND ELECTRICAL INTERCONNECTION MODULE AND METHOD FOR PRODUCING SAME

(75) Inventors: Juhyun Yu, Mito (JP); Kouki Hirano, Hitachinaka (JP); Takami Ushiwata, Hitachi (JP); Kenichi Murakami, Hitachi (JP)

(73) Assignees: Hitachi Cable, Ltd., Tokyo (JP); Hitachi Cable Fine-Tech, Ltd., Hitachi-Shi, Ibaraki (JP)

( * ) Notice: Subject to any disclaimer, the term of this patent is extended or adjusted under 35 U.S.C. 154(b) by 181 days.

(21) Appl. No.: 12/805,536

(22) Filed: Aug. 4, 2010

(65) Prior Publication Data

US 2011/0052205 A1    Mar. 3, 2011

(30) Foreign Application Priority Data

Aug. 31, 2009   (JP) ................................. 2009-199589

(51) Int. Cl.
*G02B 6/44* (2006.01)
*H04B 10/12* (2006.01)
(52) U.S. Cl. ............ 385/101; 385/114; 385/92; 385/88; 385/14; 398/142
(58) Field of Classification Search .............. 385/53, 385/101, 88, 89, 92, 93, 94, 114, 14, 129, 385/130, 131, 132; 398/142; 439/577
See application file for complete search history.

(56) References Cited

U.S. PATENT DOCUMENTS

| | | | | |
|---|---|---|---|---|
| 4,597,631 | A | * | 7/1986 | Flores ............................. 385/53 |
| 4,991,927 | A | * | 2/1991 | Anstey ............................ 385/53 |
| 5,337,388 | A | * | 8/1994 | Jacobowitz et al. ............ 385/76 |
| 5,367,593 | A | * | 11/1994 | Lebby et al. .................... 385/53 |
| 6,334,012 | B1 | | 12/2001 | Yoon et al. |
| 6,504,107 | B1 | | 1/2003 | Kragl |
| 6,829,398 | B2 | | 12/2004 | Ouchi |
| 6,940,477 | B2 | | 9/2005 | Moon et al. |
| 7,149,389 | B2 | * | 12/2006 | Yoon et al. ...................... 385/43 |
| 7,454,096 | B2 | * | 11/2008 | Dangler et al. ................. 385/14 |
| 7,751,660 | B2 | | 7/2010 | Ueno et al. |
| 2003/0034963 | A1 | | 2/2003 | Moon et al. |
| 2008/0003840 | A1 | * | 1/2008 | Sontage et al. ................ 439/55 |

(Continued)

FOREIGN PATENT DOCUMENTS

JP   53-23088 A   3/1978
JP   62-81318 U   5/1987

(Continued)

OTHER PUBLICATIONS

Notification of Reason(s) for Refusal dated Apr. 24, 2012, with English translation.

*Primary Examiner* — Brian Healy
(74) *Attorney, Agent, or Firm* — McGinn IP Law Group, PLLC

(57) ABSTRACT

A combined optical and electrical interconnection module includes a flat cable comprising an optical transmission line and an electrical wire, and a printed circuit board including a light receiving module for receiving optical signals and/or a light sending module for sending optical signals and an optical waveguide for the optical signals to be transmitted therethrough or an optical block for bending the optical paths of the optical signals. The printed circuit board is electrically and optically connected to both ends or one end of the flat cable.

9 Claims, 8 Drawing Sheets

U.S. PATENT DOCUMENTS

2008/0152286 A1 6/2008 Ueno et al.
2008/0310848 A1 12/2008 Yasuda et al.
2011/0052205 A1* 3/2011 Yu et al. .................... 398/142

FOREIGN PATENT DOCUMENTS

| JP | 11-53959 A | 2/1999 |
|---|---|---|
| JP | 2000-214972 A | 8/2000 |
| JP | 2002-529787 A | 9/2002 |
| JP | 2002-366340 A | 12/2002 |
| JP | 2003-14546 A | 1/2003 |
| JP | 2003-57468 A | 2/2003 |
| JP | 2005-164871 A | 6/2005 |
| JP | 2005-327575 A | 11/2005 |
| JP | 2007-241211 A | 9/2007 |
| JP | 2008-159766 A | 7/2008 |
| JP | 2008-244774 A | 10/2008 |
| JP | 2008-262116 A | 10/2008 |
| JP | 2008-310066 A | 12/2008 |
| WO | WO 2007/091733 A2 | 8/2007 |

* cited by examiner

| 301 ELECTRICAL WIRING |
| 302 INSULATING LAYER |
| 303 OPTICAL WAVEGUIDE |
| 305 REFLECTIVE PORTION |
| 306 OPTICAL TRANSMISSION LINE GROOVE |

| 104 PRINTED CIRCUIT BOARD |
| 303 OPTICAL WAVEGUIDE |
| 305 REFLECTIVE PORTION |
| 306 OPTICAL TRANSMISSION LINE GROOVE |
| 501 ELECTRICAL WIRING GROOVE |

# COMBINED OPTICAL AND ELECTRICAL INTERCONNECTION MODULE AND METHOD FOR PRODUCING SAME

The present application is based on Japanese patent application No. 2009-199589 filed on Aug. 31, 2009, the entire contents of which are incorporated herein by reference.

BACKGROUND OF THE INVENTION

1. Field of the Invention

The present invention relates to a combined optical and electrical interconnection module, in which optical transmission lines for transmitting optical signals, and electrical wirings for transmitting electrical signals are combined together, to be built in an information processing device, such as a large screen imaging device, and used for signal transmission therein, or used for signal transmission between information processing devices, such as servers.

2. Description of the Related Art

In recent years, with increasing display resolution, with increasing screen size, and with increasing data amount to be managed by information transmission devices or storage devices, there have been increasing demands for high speed transmission lines capable of long distance and high speed transmission of data. As high speed transmission lines, there have been used coaxial cables having a shield function, or differential transmission lines comprising a pair of differential lines in a shield, but the transmission distance thereof has been limited due to problems of noise or skew.

As a solution to this, there has been an optical transmission method that provides optical transmission lines in portions which transfer information signals, such as between an information processing device (a main unit) and a monitor, or between servers.

As a device used for these optical transmissions, there has been a combined optical and electrical cable with an optical fiber and an electrical cable combined together. The combined optical and electrical cable is, at both ends thereof, provided with an optical device such as an LD (laser diode) or a PD (photodiode), an IC (integrated circuit) for driving the optical device, and an electrical connector for connecting to an information transmission device or a storage device.

Refer to JP-A-2003-57468, JP-A-2008-159766, JP-A-2000-214972, and JP-A-2002-366340, for example.

SUMMARY OF THE INVENTION

When a flexible printed circuit board is used as the combined optical and electrical wiring cable, the flexible printed circuit board produced has however been limited in size, due to resist patterning using a mask and subsequent copper layer etching to define a copper pattern which serves as an electrical wiring pattern. It has therefore been difficult to produce the long scale flexible printed circuit boards, which are 1 or more meter long, for example. Also, its electrical wiring has large resistance due to the copper layer used being thin (approximately 6-50 μm thick), and when the entire circuit is long, the electrical wiring resistance has been innegligible. Further, the large resistance of the electrical wiring has made large (a few hundreds of mA or more) electrical current signal transmission difficult.

Also, in the case of an optical waveguide using a polymeric material (polymer or the like) for the optical transmission lines, a transmission loss of approximately 0.1 dB/cm has occurred. At transmission distances of 0.3 m or more, this has increased the optical transmission loss, and in particularly, the transmission distance exceeding 1 m has made practical implementation difficult. Also, the polymeric material (polymer or the like) used is expensive compared with general silica glass based optical fibers, and therefore costly when its amount used is increased in order to make the transmission distance long.

Accordingly, it is an object of the present invention to provide a combined optical and electrical interconnection module, capable of low cost, low loss, and long scale optical signal transmission, and large electrical current signal transmission.

(1) According to one embodiment of the invention, a combined optical and electrical interconnection module comprises:

a flat cable comprising an optical transmission line and an electrical wire; and a printed circuit board comprising a light receiving module for receiving optical signals and/or a light sending module for sending optical signals, and an optical waveguide for the optical signals to be transmitted therethrough, wherein the printed circuit board is electrically and optically connected to both ends or one end of the flat cable.

(2) According to another embodiment of the invention, a combined optical and electrical interconnection module comprises:

a flat cable comprising an optical transmission line and an electrical wire; and a printed circuit board comprising a light receiving module for receiving optical signals and/or a light sending module for sending optical signals, and an optical block for bending the optical paths of the optical signals, wherein the printed circuit board is electrically and optically connected to both ends or one end of the flat cable.

In the above embodiments (1) and (2) of the invention, the following modifications and changes can be made.

(i) The printed circuit board further comprises an optical transmission line groove for being engaged with a portion of the optical transmission line of the flat cable, an electrical wiring pattern for being electrically connected with the electrical wire of the flat cable, and an electrical wiring groove formed in an upper side of the printed circuit board relative to the electrical wiring pattern, the upper side being formed with the optical waveguide.

(ii) The printed circuit board further comprises an optical transmission line groove for being engaged with a portion of the optical transmission line of the flat cable, an electrical wiring pattern for being electrically connected with the electrical wire of the flat cable, and an electrical wiring groove formed in an upper side of the printed circuit board relative to the electrical wiring pattern, the upper side being formed with the optical transmission line groove.

(iii) The printed circuit board further comprises an electrical connector at its opposite end face to its end face with the optical transmission line groove formed therein, the electrical connector being insertable into or removable from an electrical connector disposed in an external device.

(iv) The optical waveguide or the optical block is disposed in the middle in the width direction thereof, the optical transmission line is disposed in the middle in the width direction thereof, and the electrical wiring wire is disposed on both sides of the printed circuit board and the flat cable.

(v) The printed circuit board is not more than 5 cm in length, and the optical transmission line of the flat cable is not less than 20 cm in length.

(3) According to another embodiment of the invention, a method for producing a combined optical and electrical interconnection module comprises:

arranging a plurality of optical transmission lines in its middle, and a plurality of electrical wires on both sides of the plural optical transmission lines;

pressure bonding thereto two coverings formed with openings having a specified gap therebetween, in such a manner as to sandwich upper and lower surfaces of the optical transmission lines and the electrical wires between the two coverings, to produce a flat cable;

removing portions of the optical transmission lines and the electrical wires in the openings in the flat cable formed with the openings having the specified gap therebetween;

removing the coverings on the optical transmission lines and the electrical wires in the openings in the flat cable to bare the optical transmission lines and the electrical wires to protrude from end faces of the flat cable;

structuring a printed circuit board, the printed circuit board having electrical wiring layers laminated with an insulating layer therebetween, the laminated electrical wiring layers being electrically connected with each other through a through hole, a surface of one of the electrical wiring layers being formed with an optical waveguide layer for optical signals to be transmitted therethrough;

forming in a portion of the optical waveguide a reflective portion for bending the optical paths of the optical signals, and mounting, on a surface of an other of the electrical wiring layers above the reflective portion, a light receiving module for receiving optical signals and/or a light sending module for sending optical signals;

forming optical transmission line grooves in the printed circuit board, to be engaged onto the optical transmission lines respectively protruding from the flat cable, and thereby connected and fixed thereto with an optical adhesive, to optically connect the light receiving module and/or the light sending module and the optical transmission lines;

forming an electrical connector at an opposite end face of the printed circuit board to its end face with the optical transmission line grooves formed therein;

forming, in the printed circuit board, electrical wiring grooves and electrical wiring patterns therein, to regulate the electrical wires of the flat cable to be positioned into the electrical wiring grooves, and thereby electrically connected and fixed to the electrical wiring patterns, respectively, with solder or a conductive adhesive;

after the joining of the flat cable and the printed circuit board, covering the printed circuit board and a portion of the flat cable with a protective member; and cutting the printed circuit board between the light receiving module or the light sending module and the light sending module or the light receiving module.

According to one embodiment of the invention, an optical fiber is mostly used as an optical transmission line and an optical waveguide of a polymeric material (polymer or the like) is used only a few cm long, so that optical signal can be transmitted at low loss and low cost, even at entire transmission distances of 0.3 m or more. Especially when the optical transmission distance exceeds 1 m, that effect is significant.

Also, electrical signals are transmitted through an electrical wire or cable disposed in a flexible flat cable, so that large (a few hundreds of mA or more) electrical current signal can be transmitted therethrough.

A combined optical and electrical interconnection module is structured to electrically and optically connect a printed circuit board mounted with a light receiving module for receiving optical signals and/or a light sending module for sending optical signals, to the flat cable comprising the optical transmission line and the electrical wire, therefore eliminating a need for wire bonding, and thereby allowing parasitic capacitances to be reduced. This permits transmission at high speeds of 5 Gbit/sec or more. Also, an optical transmission line groove and an electrical wiring groove formed in the flexible printed board are engaged onto the optical fiber and the electrical wire respectively extending from both the ends of the flat cable, thereby regulating the optical fiber and the electrical wire to be positioned, connected and fixed into the optical transmission line groove and the electrical wiring groove in such a manner that the optical transmission line groove and the electrical wiring groove overlap the optical fiber and the electrical wire respectively, therefore allowing the easy and high precision connection thereof.

BRIEF DESCRIPTION OF THE DRAWINGS

The preferred embodiments according to the invention will be explained below referring to the drawings, wherein:

FIGS. 6A-6G are top views showing a process for producing the combined optical and electrical interconnection module in the embodiment according to the invention, wherein FIG. 6A is a top view of flat cable (FFC), FIG. 6B shows removed laminate portions of FFC, FIG. 6C shows remove portions of electrical wires & optical fibers of FFC, FIG. 6D shows a flexible printed circuit board (FPC), FIG. 6E shows mounting optical devices & electronic components on FPC, FIG. 6F shows connecting FPC in FIG. 6E to FFC, and FIG. 6G shows cutting middle of FPC;

DETAILED DESCRIPTION OF THE PREFERRED EMBODIMENTS

Figure 1:
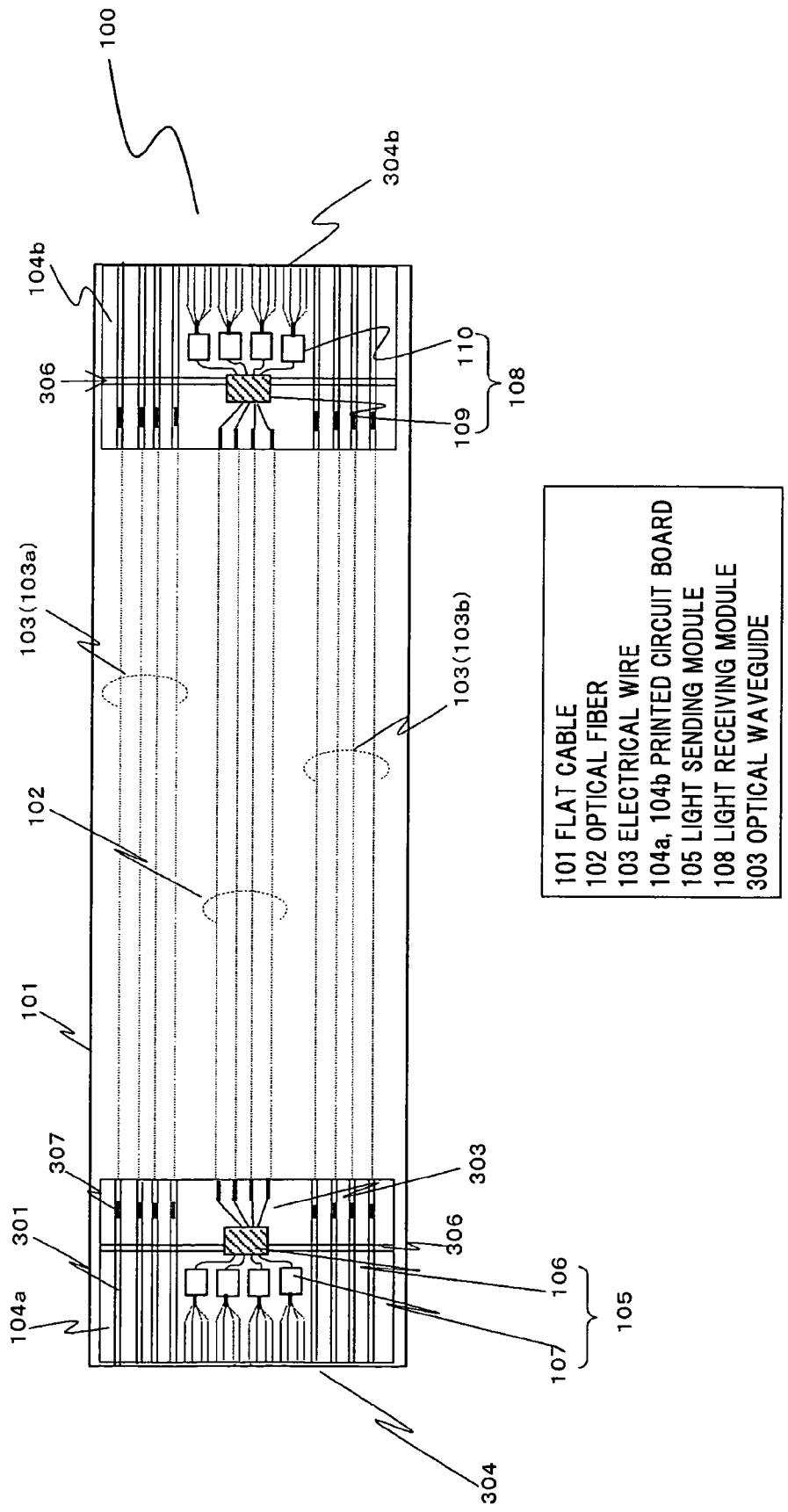
FIG. 1 is a top view showing a combined optical and electrical interconnection module in an embodiment according to the invention.

Below are described the preferred embodiments of the invention in conjunction with the accompanying drawings, in which like parts are given like reference numerals.

Combined Optical and Electrical Interconnection Module 100 Structure

Figure 2:
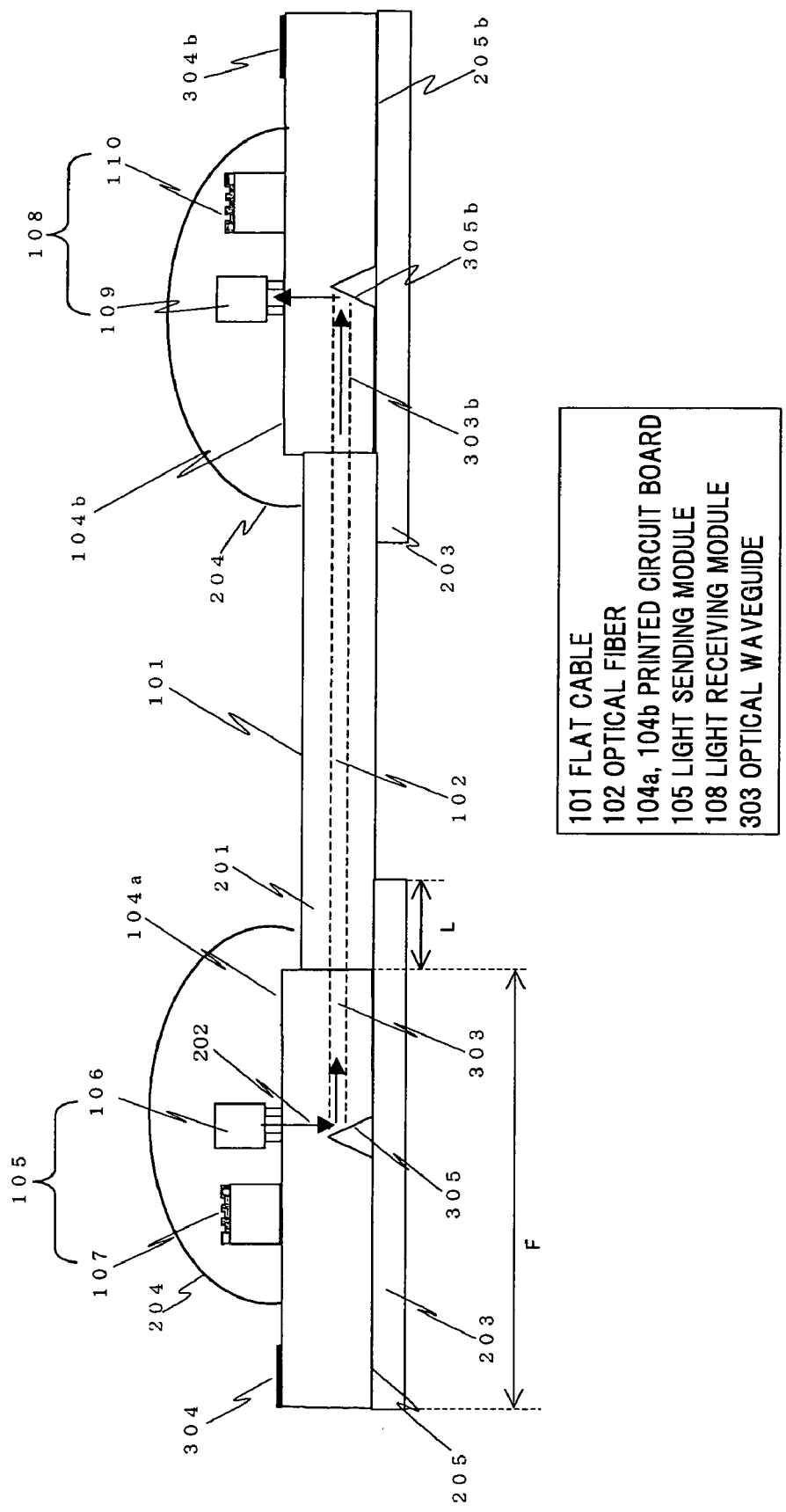
FIG. 2 is a transverse cross-sectional view showing the combined optical and electrical interconnection module in the embodiment according to the invention.

FIG. 1 is a top view showing a combined optical and electrical interconnection module 100, and FIG. 2 is a transverse cross-sectional view showing the same.

A flat cable (FFC) 101 is flexible (has flexibility), and is constructed of four optical fibers 102 for optical transmission lines, and eight electrical wires 103 for power supply and electrical signal transmission. The flat cable 101 is structured to be protected by being covered with an outer insulating laminate film 201 made of a material such as a polyetherimide, a polyethylene terephthalate, or the like. The optical fibers 102 are a single mode optical fiber, but may use a holey fiber, which allows a reduced optical loss even due to small bend, and an increased degree of freedom of wiring, therefore aiding in wiring. On the other hand, the use of a multimode optical fiber aids in optical coupling to a light emitting device (laser diode) because the core diameter of the multimode optical fiber is 50 μm or more.

The electrical wires 103 are made of a metallic material such as a copper or the like, and formed in a flat rectangular cross-sectional shape being, for example, 0.1 mm thick and 0.2 mm wide. The 0.1 mm thick permits large (a few hundreds of mA) electrical current signal transmission.

Flexible Minted Board 104 (104a, 104b)

Flexible printed boards 104a and 104b have flexibility, and are connected to both ends respectively of the flat cable 101. The flexible printed boards 104a and 104b (see FIG. 3) comprise a copper layer formed of an electrical wiring 301 for electrical signal transmission, a polyimide layer for serving as an insulating layer 302, and an optical waveguide layer 303 for optical signal transmission. The electrical wiring 301 is formed by patterning using a mask. The optical waveguide 303 for optical signal transmission uses a polymeric material (polymer or the like), and has flexibility. The pattern of the optical waveguide 303 may be formed by patterning using a mask, or by a mold.

Operation of the Combined Optical and Electrical Interconnection Module 100

Figure 4:
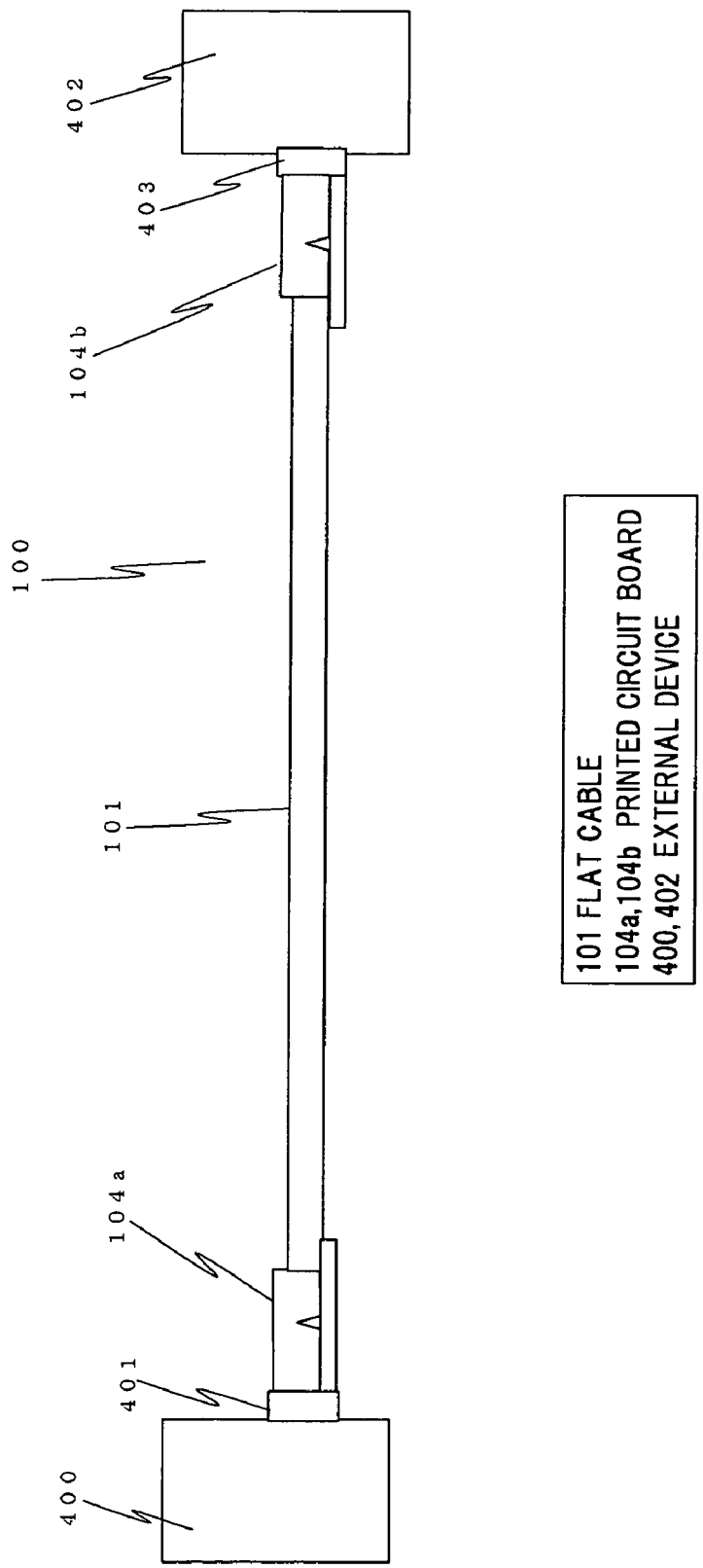
FIG. 4 is a diagram showing a use of the combined optical and electrical interconnection module.

FIG. 4 is a diagram for explaining a use of the combined optical and electrical interconnection module 100. In this use, the signal transmission between external devices 400 and 402 is performed through the combined optical and electrical interconnection module 100.

Though not shown, in another use of the combined optical and electrical interconnection module 100, the combined optical and electrical interconnection module 100 may be used for signal transmission inside an information processing device. The information processing device may correspond to any of the external devices 400 and 402 in FIG. 4.

Next is described a flow of the signal transmission in conjunction with FIGS. 1 to 4.

An electrical connector 401 of the external device 400 is connected with a card edge connector 304 of the flexible printed board 104a connected to the left end of the flat cable 101. Likewise, an electrical connector 403 of the external device 402 is connected with a card edge connector 304b of the flexible printed board 104b connected to the right end of the flat cable 101. An electrical signal is sent from the external device 400 through the electrical connector 401 to the flexible printed board 104a, and transmitted to an light transmitting module 105 mounted on the flexible printed board 104a. The light transmitting module 105 comprises a four VCSEL (vertical cavity surface emitting laser diode) array 106 and a laser driver IC (integrated circuit) 107 for driving the VCSEL array 106. The electrical signal transmitted from the external device 400 is converted by the VCSEL array 106 into optical signals 202. The respective optical paths of the optical signals 202 emitted from the VCSEL array 106 are bent through 90 degrees by a reflective portion 305, and coupled to an optical waveguide 303 disposed in the flexible printed board 104a. The optical signals 202 are propagated through the optical waveguide 303, and transmitted through the optical fibers 102 respectively of the flat cable 101, and coupled to an optical waveguide 303b connected to the right end of the flat cable 101. The optical signals 202 are propagated through the optical waveguide 303b, and their respective optical paths are bent through 90 degrees by a reflective portion 305b formed in the optical waveguide 303b, and transmitted into a light receiving module 108 mounted on the flexible printed board 104b. The light receiving module 108 comprises a four PD (photodiode) array 109 and a preamplifier IC 110. The received optical signals are converted by the PD array 109 into electrical signals. Those electrical signals are amplified by the preamplifier IC 110, and one way transmitted through the card edge connector 304b into the external device 402.

In the above embodiment, since the four VCSEL array 106 and the four PD array 109 have been disposed, the simultaneous optical transmissions are possible for the four channels.

End Face Structure of the Flexible Printed Board 104 (104a, 104b)

Figure 5:
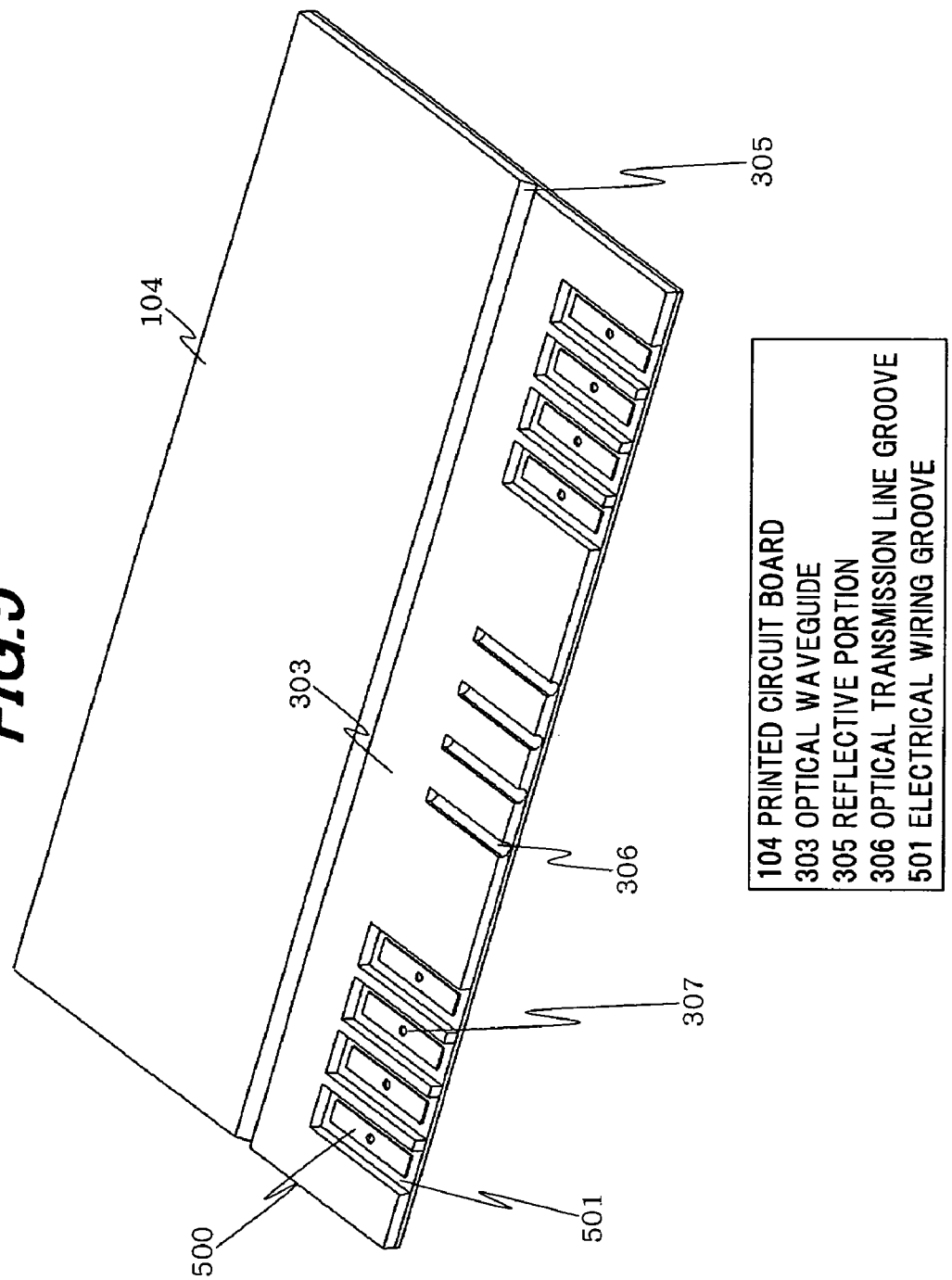
FIG. 5 is an explanatory diagram for explaining a configuration of an end face of the flexible printed board to be connected with a flat cable.

FIG. 5 shows a structure of an end face of the flexible printed board 104 (104a, 104b) to be connected with the flat cable 101. In one surface of each of the flexible printed boards 104a and 104b are formed optical transmission line grooves 306 for the optical fibers 102 or the like, and a reflective portion 305 (305b) for causing the optical signals 202 from the optical fibers 102 to be reflected and transmitted into the light receiving module 108, or for causing the optical signals 202 from the light transmitting module 105 to be reflected and transmitted into the optical fibers 102. The reflective portion 305 (305b) is defined as a V-shaped groove in the optical waveguide 303 (303b) disposed in the surface formed with the optical transmission line grooves 306 of the flexible printed board 104 (104a, 104b), where the V-shaped groove is formed by V-shape dicing the surface of the flexible printed board 104 (104a, 104b), to form a surface slanted at 45 degrees to a perpendicular to the surface of the flexible printed board 104 (104a, 104b), in the optical waveguide 303 (303b) disposed in the flexible printed board 104 (104a, 104b). This reflective portion 305 (305b) allows the optical paths to be bent through 90 degrees. Further, this reflective portion 305 (305b) may be metallized with a metallic thin film (gold, aluminum, or the like), which is effective in enhancing reflectivity and thereby reducing optical signal loss due to reflection. The reflective portion 305 (305b) formed with the metallic thin film may be filled with a resin therein to thereby prevent the metallic thin film from peeling off.

Referring to FIG. 2, the opposite surfaces of the flexible printed boards 104a and 104b to the surfaces formed with the reflective portions 305 and 305b respectively are mounted with the VCSEL array 106 or the PD array 109 in an extension of an optical axis of each of the reflective portions 305 and 305b.

Figure 3:
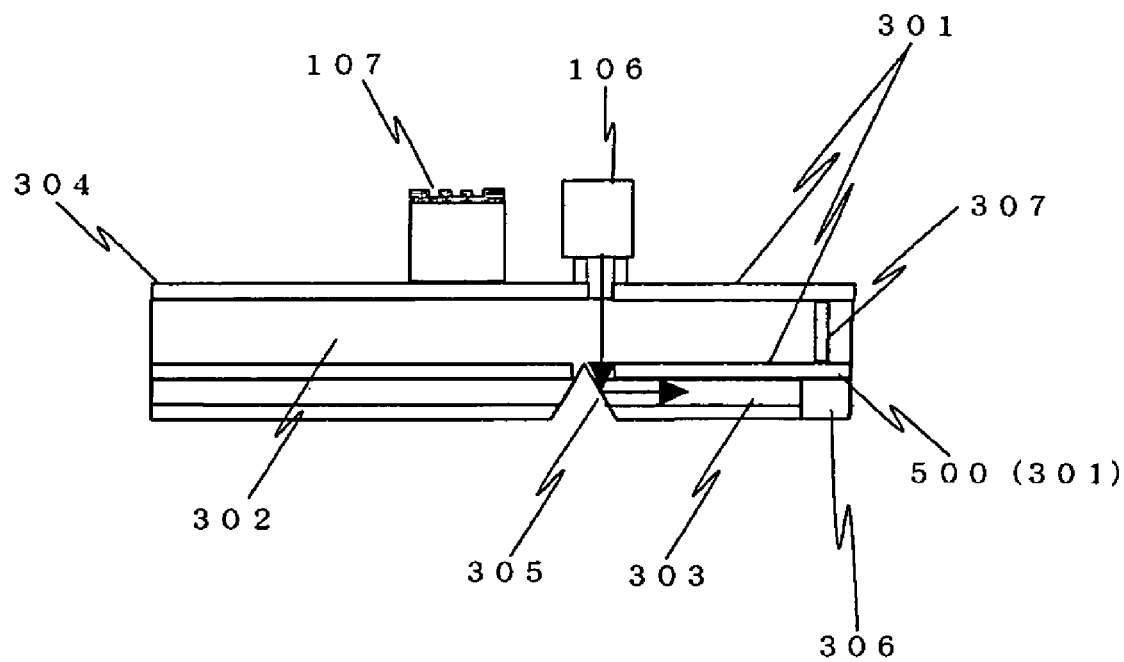
FIG. 3 is a transverse cross-sectional view showing a flexible printed board in the embodiment according to the invention.

Also, referring to FIG. 3, the flexible printed boards 104a and 104b are each formed with the optical transmission line grooves 306, and with electrical wiring patterns 500 to connect with the electrical wires 103 of the flat cable 101. The flexible printed boards 104a and 104b are each structured to have two electrical wiring 301 layers laminated with a polyimide layer serving as an insulating layer 302 therebetween. The two electrical wiring 301 layers are electrically connected with each other via a conductive material, such as solder or the like, injected or disposed in a through hole 307 formed in the flexible printed boards 104a and 104b.

In FIG. 3, the electrical wiring patterns 500 are then structured to be disposed in the inner side of the flexible printed boards 104a and 104b relative to the optical waveguide 303 (303b). This causes the optical waveguide 303 (303b) layer lying in the lower (in FIG. 5, upper) side of the flexible printed boards 104a and 104b relative to the electrical wiring patterns 500 to obstruct the connection of the electrical wires 103 of the flat cable 101 to the electrical wiring patterns 500. Accordingly, the optical waveguide 303 (303b) layer is formed by such patterning that no optical waveguide 303 (303b) layer lies in the lower (in FIG. 5, upper) side of the flexible printed boards 104a and 104b relative to the electrical wiring patterns 500. This allows electrical wiring grooves 501 but no optical waveguide 303 (303b) layer to be formed in the lower (in FIG. 5, upper) side of the flexible printed boards 104a and 104b relative to the electrical wiring patterns 500. This results in the exposed electrical wiring patterns 500 structure (see FIG. 5). This allows the connection almost without bending of the electrical wires 103 of the flat cable 101 to the electrical wiring patterns 500. The connection of the electrical wires 103 of the flat cable 101 to the electrical wiring patterns 500 is therefore facilitated. Further, because of not bending, the wiring is the shortest, and therefore has an advantage in high speed transmission.

The optical transmission line grooves 306 formed in the flexible printed boards 104a and 104b are engaged onto the optical fibers 102, respectively, protruding from the flat cable 101, thereby allowing the flexible printed boards 104a and 104b to be connected to the optical fibers 102 in such a manner that the flexible printed boards 104a and 104b overlap the optical fibers 102. In this case, at the same time, the electrical wires 103 are also regulated to be positioned into the electrical wiring grooves 501 respectively, thereby allowing the electrical wires 103 to be positioned and connected to the electrical wiring patterns 500. In this manner, this structure allows the easy and high precision connection of the flat cable 101 and the flexible printed boards 104a and 104b.

Referring to FIG. 1, the flexible printed boards 104a and 104b are each structured to have the optical waveguide 303 disposed in the middle in the width direction thereof, and the electrical wirings 301 disposed in the upper and lower sides, respectively, of the flexible printed board 104a or 104b relative to the optical waveguide 303. Likewise, the flat cable 101 is structured to have the optical fibers 102 disposed in the middle in the width direction thereof, and the electrical wires 103 (103a) and 103 (103b) disposed in the upper and lower sides, respectively, of the flat cable 101 relative to the optical fibers 102. For example, the electrical wires 103a are disposed in the upper side of the flat cable 101 of FIG. 1, while the electrical wires 103b for slow electrical signal transmission are disposed in the lower side thereof, and the space between the electrical wires 103a and the electrical wires 103b for slow electrical signals is widen, thereby allowing the reduction of the effect of electrical noise.

As mentioned above, the electrical wires 103a and 103b of the flat cable 101 are for power supply and for slow electrical signal transmission, and in this embodiment, comprise four power wires (two grounds, one plus power supply, and one minus power supply), and four slow electrical signal wires (transmission speed: 10 Kbit/sec or less). Further, of the four slow electrical signal wires 103b, the two middle electrical signal wires may be slow electrical signal wires, and the two side electrical signal wires may be ground wires. This configuration aids in impedance matching.

Referring to FIG. 5, the optical transmission line grooves 306 formed in the optical waveguide 303 layer are spaced at the same pitch as the pitch at which are disposed the optical fibers 102 in the flat cable 101. In this embodiment, the pitch is 500 μm. Further, the flexible printed boards 104a and 104b are each formed with the electrical wiring patterns 500 at the same pitch and positions as the pitch and positions of the electrical wires 103a and 103b of the flat cable 101.

Referring to FIGS. 1 and 2, on the other hand, the flexible printed boards 104a and 104b are formed with the electrical card edge connectors 304 and 304b respectively at the opposite end face to the end face with the optical transmission line grooves 306 formed therein. The card edge connectors 304 and 304b for the flexible printed boards 104a and 104b may then be inserted into or removed from the electrical connectors 401 and 403 provided for the external devices 400 and 402 respectively (see FIG. 4).

Also, referring to FIG. 2, with an adhesive, a protective sheet 203 is mounted on the opposite surface of each of the flexible printed boards 104a and 104b to the surface thereof with the light transmitting module 105 or the light receiving module 108 mounted thereon. The protective sheets 203 are mounted to cover the entire surfaces 205 and 205b of the flexible printed boards 104a and 104b and the flat cable 101 portions (L=2 to 5 mm) respectively, and thereby ensure the strength and solidity thereof. This permits the sufficient strength thereof during attaching to or detaching from the electrical connectors 401 and 403. The protective sheet 203 may be formed of a resin material, a metallic material, a plastic material, or the like, and have a thickness which satisfies strength requirements, and in the case of a resin, be 0.2 mm or more thick.

On the side of each of the flexible printed boards 104a and 104b on which is mounted the light transmitting module 105 or the light receiving module 108, on the other hand, the entire flexible printed boards 104a and 104b and the flat cable 101 portions are covered with a laminate 204, excluding the card edge connectors 304 and 304b. The laminate 204 material may use a PET (polyethylene terephthalate), a PI (polyimide), or the like. Here, the laminate 204 may be replaced by resin fill.

The flexible printed boards 104a and 104b are formed with circuit patterns (not shown) for electrical signal transmission between the light transmitting module 105 or the light receiving module 108 and the flexible printed boards 104a and 104b, to electrically connect the electrode patterns formed on the flexible printed boards 104a and 104b via solder or the like and the light transmitting module 105 or the light receiving module 108 (see FIG. 2).

The light transmitting module 105 or the light receiving module 108 and electronic components can therefore be electrically connected to the flexible printed boards 104a and 104b without using wire bonding, and parasitic capacitances are thereby reduced. This has an advantage especially in transmission at high speeds of 5 Gbit/sec or more.

Also, the length F of the flexible printed boards 104a and 104b is as short as on the order of 2 to 3 cm, preferably not more than 5 cm. A small amount of polymeric material (polymer or the like) may therefore be used for producing the optical waveguide 303, and the low cost production thereof is possible. Accordingly, the optical path length of the optical waveguide 303 is also short, and its optical transmission loss level is negligible (on the order of 0.1 to 0.2 dB). Most of the optical transmission is then performed through the optical fibers 102 disposed in the flat cable 101. The transmission loss of the optical fibers 102 is less than 0.1 dB/km, and therefore negligible at optical transmission line lengths of up to approximately 1 km. The invention is suitable for the combined optical and electrical interconnection module 100 having a length of not less than 0.3 m, which is low in optical transmission loss and which can be provided at a low cost. In the 0.3 m shortest combined optical and electrical interconnection module 100, the total length of the flexible printed boards 104a and 104b is not more than 0.1 m, while the rest is the length (not less than 0.2 m) of the optical fibers 102 disposed in the flat cable 101. At lengths of the combined optical and electrical interconnection module 100 of less than 0.3 m, the effect of reducing the optical transmission loss and cost is unlikely to be exhibited, compared with flexible optical waveguides in which all optical transmission lines are fabricated from a polymeric material. On the other hand, the upper limit of the length of the combined optical and electrical interconnection module 100 is as sufficient as on the order of 100 m in view of transmission between servers, but the invention structure allows the upper limit applied of the length of the combined optical and electrical interconnection module 100 to be up to approximately 1 km, because of the small transmission loss of the optical fibers 102 as mentioned previously.

Combined Optical and Electrical Interconnection Module 100 Producing Method

Next is described a process for producing the combined optical and electrical interconnection module 100 in reference to FIGS. 6A-6G.

Figure 6D:
Figure 6E:
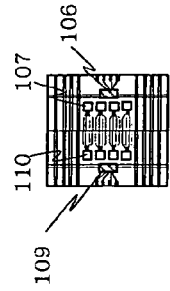
Figure 6F:
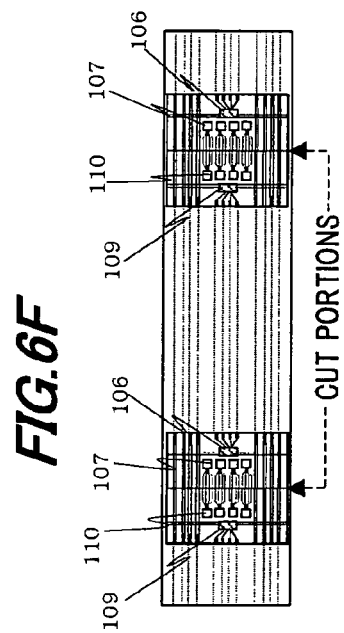
Figure 6G:
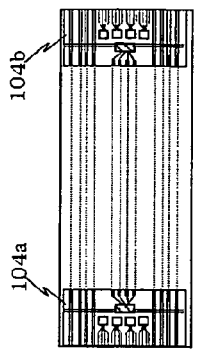
Figure 6A:
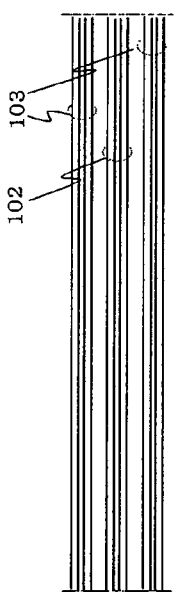

Referring to FIG. 6A, the four optical fibers 102 to serve as optical transmission lines are arranged in the middle, and the four electrical wires 103 are on both sides of the optical fibers 102.

Figure 6B:
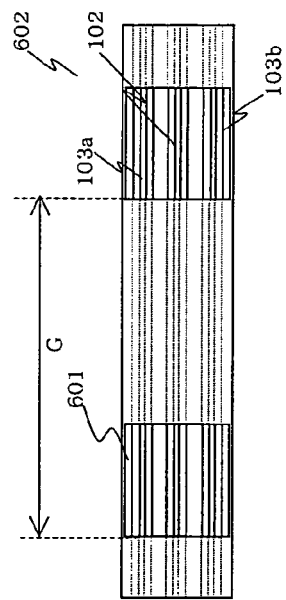

Referring to FIG. 6B, this is followed by forming two coverings (laminates) formed with openings 601 having a specified gap G (e.g. 1 m) therebetween, in such a manner as to sandwich the upper and lower surfaces of the four optical fibers 102 and the eight electrical wires 103 of FIG. 6A between the two coverings (laminates). This results in a flat cable 602 formed with the openings 601 having the specified gap G (e.g. 1 m) therebetween.

Figure 6C:
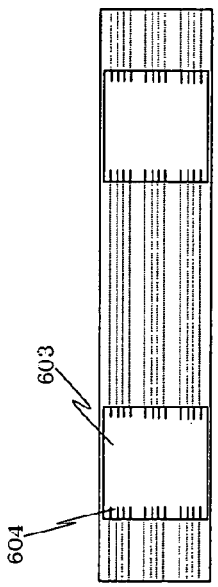

Referring to FIG. 6C, this is followed by removing portions of the optical fibers 102 and the electrical wires 103 in the openings 601 in the flat cable 602 formed with the openings 601 having the specified gap G therebetween.

The flat cable 602 is structured to have bare protrusions 604 of the optical fibers 102 and the electrical wires 103 in the openings 601, which are caused to protrude from the end faces of the flat cable 101, by removing a specified length (on the order of 2 to 5 mm as one example) of the coverings (laminates) on the optical fibers 102 and the electrical wires 103 in the openings 601.

Figure 8:
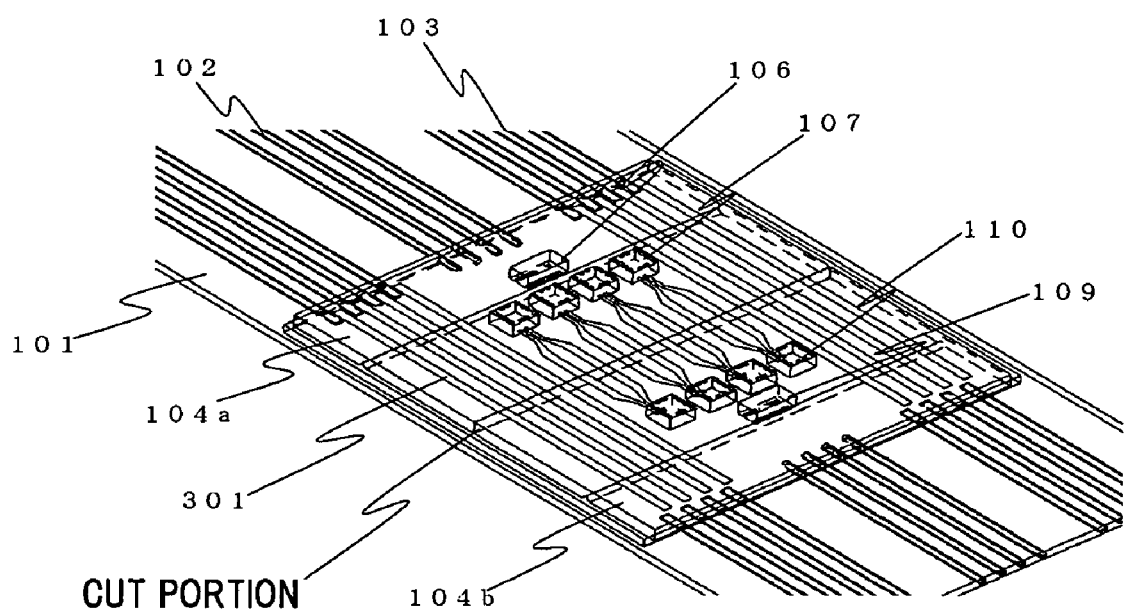
FIG. 8 is a perspective view showing a portion connecting the flat cable and the flexible printed boards.

Referring to FIGS. 6D, 6E and 8, on the other hand, using solder, a conductive adhesive or the like, electrode patterns formed on the flexible printed board 104 (104a, 104b) are electrically connected to the light transmitting module 105 or the light receiving module 108 and electronic components. The flexible printed board 104 (104a, 104b) is then formed with the optical transmission line grooves 306 and the electrical wiring grooves 501. The methods for producing these are as described in the description of the end face structure of the flexible printed board 104 (104a, 104b). The electrical wiring grooves 501 are formed for the optical waveguide 303 (303b) side electrical wiring patterns 500. This results in the exposed electrical wiring patterns 500 structure without the optical waveguide 303 (303b) layer being formed in the upper side of the flexible printed board 104 (104a, 104b) relative to the optical waveguide 303 (303b) side electrical wiring patterns 500.

Referring to FIG. 6F, this is followed by overlapping and connecting the surface of the flexible printed board 104 (104a, 104b), which is formed with the optical transmission line grooves 306 and the electrical wiring patterns 500, and the optical fibers 102 and the electrical wires 103.

The exposed optical fibers 102 of the flat cable 101 are engaged into the optical transmission line grooves 306 respectively formed in the flexible printed board 104 (104a, 104b), thereby optically connecting the light transmitting module 105 or the light receiving module 108 and the optical fibers 102, while the electrical wires 103 of the flat cable 101 are regulated to be positioned into the electrical wiring grooves 501 respectively formed in the flexible printed board 104 (104a, 104b), thereby allowing the electrical wires 103 to be positioned and connected to the electrical wiring patterns 500, using solder, a conductive adhesive or the like.

Also, the optical transmission line grooves 306 and the optical fibers 102 are connected and fixed to each other respectively with an optical transparent adhesive (ultraviolet cured resin).

The joining of the flat cable 101 and the flexible printed board 104 (104a, 104b) is followed by covering and protecting the joined portions thereof with the protective sheets 203 below and the laminates 204 above respectively. The protective sheets 203 are sized to support the entire flexible printed board 104 (104a, 104b) and the flat cable 101 portions respectively.

Referring to FIG. 6G, the coupled portions of the flat cable 101 and the flexible printed board 104 (104a, 104b) are laminated (covered) from above and below to cover the entire flexible printed board 104 (104a, 104b) and the flat cable 101 portions. The covering of the coupled portions of the flat cable 101 and the flexible printed board 104 (104a, 104b) is followed by cutting substantially in the middle of each array of the light transmitting module 105 column and the light receiving module 108 column mounted on the flexible printed boards 104a and 104b respectively, resulting in the completed combined optical and electrical interconnection module 100.

The combined optical and electrical interconnection module 100 can be fabricated to have any length by varying the gap G between the openings 601.

One or more light transmitting modules 105 and one or more light receiving modules 108 are mounted on the flexible printed boards 104a and 104b connected to both the ends respectively of the flat cable 101, thereby allowing the two-way transmitting/receiving of optical signals for one or more channels. For example, as shown in FIG. 1, the flexible printed boards 104a and 104b may be mounted with the four channel VCSEL array 106 and the four channel PD array 109 respectively, and the number of the optical fibers 102 of the flat cable 101 may be eight, thereby allowing the two-way transmitting and receiving of optical signals for four channels. Further, the card edge connectors 304 and 304b are structured to be rotationally symmetric about the central axis in the width direction of the circuits. In the use of the combined optical and electrical interconnection module 100 of FIG. 4, the flexible printed board 104a mounted with only the light transmitting module 105 has to be always connected to the electrical connector 401 of the transmitting external device 400, while the flexible printed board 104b mounted with only the light receiving module 108 has to be always connected to the electrical connector 403 of the receiving external device 402. However, the structures of the flexible printed boards 104a and 104b may be modified to be used for either of the external device 400 or 402, in other words, may be used regardless of directionality of signals. Also, transmitting and receiving are possible, and therefore two-way transmission is possible.

The flexible printed boards 104a and 104b may be replaced by rigid (less flexible) printed boards (not shown) formed of a glass epoxy material. In this case, an optical waveguide layer is formed over one surface of each of the rigid printed boards, using a polymeric material (polymer or the like), in the same manner as the case of the flexible printed boards 104a and 104b. In the optical waveguide layer is then formed a reflective surface, and above the reflective surface is mounted the light transmitting module 105 or the light receiving module 108, in the same manner as the case of the flexible printed boards 104a and 104b. The use of the rigid printed boards allows sufficient strength to be maintained even though using no protective sheet. Further, the rigid printed boards may be replaced by silicon boards. When the silicon boards are used, a glass optical waveguide layer is formed over the silicon boards using CVD (chemical vapor deposition). The use of the silicon boards allows the combined optical and electrical interconnection module 100 to have excellence in dissipating the heat of the VCSEL. As described above, the invention allows the use of the printed boards, such as the flexible printed boards, the rigid printed boards, the silicon boards or the like, formed with the optical patterns (optical waveguide layers) and the electrical patterns (electrical wiring layers) thereon.

Modification to the Embodiment

Figure 7A:
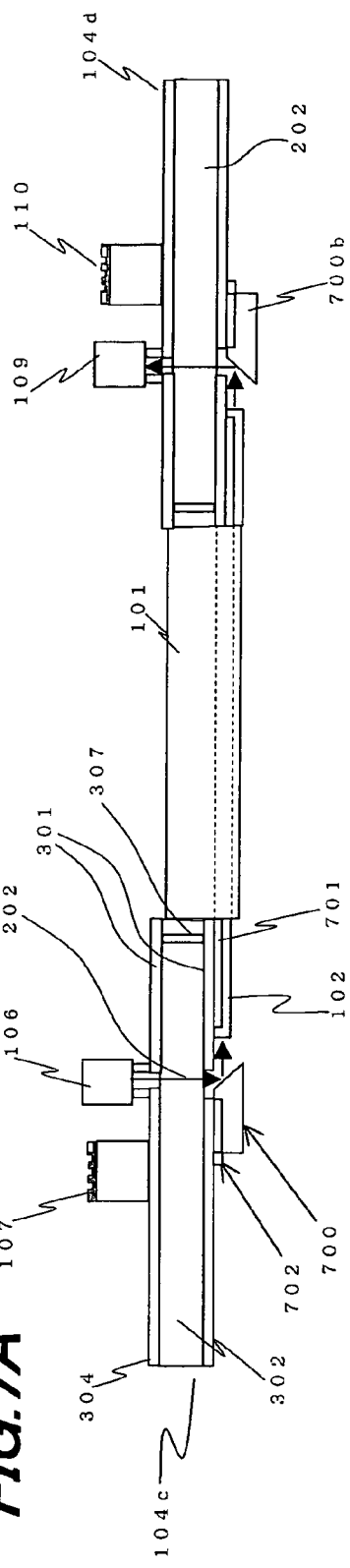
FIGS. 7A and 7B are a transverse cross-sectional view and a bottom view, respectively, showing flexible printed boards each using an optical block in place of an optical waveguide in a modification to the embodiment according to the invention.
Figure 7B:
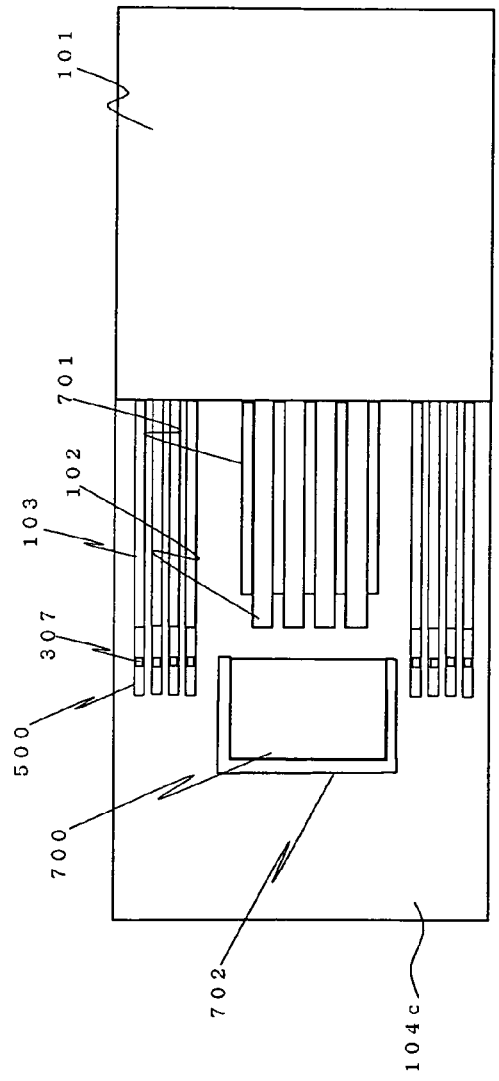

FIGS. 7A and 7B show a modification in which flexible printed boards 104c and 104d are mounted with optical blocks 700 and 700b respectively. The flexible printed boards 104c and 104d are each structured to have an insulating layer 302, which transmits optical signals, between copper layers formed of electrical wirings 301 respectively for electrical signal transmission. The flexible printed boards 104c and 104d are significantly different from the flexible printed boards 104a and 104b shown in FIG. 2, in that the flexible printed boards 104c and 104d have no optical waveguides 303 and 303b, but optical blocks 700 and 700b disposed in place of the reflective portions 305 and 305b of the optical waveguides 303 and 303b, respectively. The optical blocks 700 and 700b are formed of an optical material such as a resin, a glass material, or the like. The optical block 700 (700b) is formed with a surface slanted at 45 degrees relative to optical signals 202 emitted from the VCSEL array 106, to serve to bend their respective optical paths through 90 degrees. The slanted surface of the optical block 700 (700b) is metallized with a metallic thin film (gold, aluminum, or the like).

The flexible printed board 104c (104d) surface mounted with the optical block 700 (700b) is filled with a resin, to which a protective sheet (not shown) is bonded for reinforcing. Further, it is preferred to extend the reinforcing sheet structure to a portion of the flat cable 101, to thereby allow the reinforced portion connecting the flat cable 101 and the flexible printed board 104c (104d).

Referring to FIG. 7B, the flexible printed board 104c mounted with the optical block 700 is formed to have optical fiber positioning patterns 701 for positioning the optical fibers 102 on the same surface and with the same copper patterns as electrical wiring patterns 500. Further, optical block positioning patterns 702 for positioning the optical block 700 are also formed on the same surface and with the same copper patterns as the electrical wiring patterns 500.

The respective optical paths of the optical signals 202 emitted from the VCSEL array 106 are bent through 90 degrees by the optical block 700, so that the optical signals 202 are transmitted through the optical fibers 102 respectively of the flat cable 101 mounted to the flexible printed board 104c, and are reflected off the slanted surface of the optical block 700b mounted to the flexible printed board 104d connected to the right end of the flat cable 101, and are received in the PD array 109. The other signal processing is the same as in FIG. 2.

Since no optical waveguides 303 and 303b layers are formed, and the optical paths are bent by the optical blocks 700 and 700b, and the optical signals 202 are spatially propagated into the optical fibers 102, the producing process can be simplified. Further, since the optical fiber positioning patterns 701 and the optical block positioning patterns 702 are formed on the same surface and with the same copper patterns as the electrical wiring patterns 500, the producing process can be simplified.

Although in the above embodiments, both the ends of the flat cable 101 are provided with the flexible printed boards 104a and 104b (or 104c and 104d) respectively, only one end of the flat cable 101 may be provided with the flexible printed board 104a or 104b (or 104c or 104d), and the other end of the flat cable 101 may be in the open state of the optical fibers 102 and the electrical wires 103a and 103b, or be provided with an optical connector (not shown) attached to the optical fibers 102 and an electrical connector (not shown) attached to the electrical wires 103a and 103b. When the optical fibers 102 and the electrical wires 103a and 103b are open at the other end of the flat cable 101, the open ends of the optical fibers 102 may be connected with the ends of other optical fibers (not shown) respectively by a mechanical splice or the like, while the open ends of the electrical wires 103a and 103b may also be connected to specified electrical terminals of another printed board not shown. Also, when the other end of the flat cable 101 is provided with an optical connector (not shown) for the optical fibers 102 and an electrical connector (not shown) for the electrical wires 103a and 103b, the optical connector and the electrical connector may respectively be connected to another optical connector not shown and an electrical connector not shown.

The invention is not limited to the above embodiments, but, for example, there may be any numbers of the optical fibers 102, the arrayed PDs 109, the arrayed VCSELs 106, the electrical wires 103a and 103b. Further, various alterations should be apparent without departing from the spirit and scope of the invention.

What is claimed is:

1. A combined optical and electrical interconnection module, comprising:
   a flat cable comprising an optical transmission line and an electrical wire; and
   a printed circuit board comprising a light receiving module for receiving optical signals and/or a light sending module for sending optical signals, and an optical waveguide for the optical signals to be transmitted therethrough,
   wherein the printed circuit board is electrically and optically connected to both ends or one end of the flat cable,
   the printed circuit board further comprises an optical transmission line groove for being engaged with a portion of the optical transmission line of the flat cable, an electrical wiring pattern for being electrically connected with the electrical wire of the flat cable, and an electrical wiring groove formed in an upper side of the printed circuit board relative to the electrical wiring pattern, the upper side being formed with the optical waveguide.

2. A combined optical and electrical interconnection module, comprising:
   a flat cable comprising an optical transmission line and an electrical wire; and
   a printed circuit board comprising a light receiving module for receiving optical signals and/or a light sending module for sending optical signals, and an optical block for bending the optical paths of the optical signals,
   wherein the printed circuit board is electrically and optically connected to both ends or one end of the flat cable,
   the printed circuit board further comprises an optical transmission line groove for being engaged with a portion of the optical transmission line of the flat cable, an electrical wiring pattern for being electrically connected with the electrical wire of the flat cable, and an electrical wiring groove formed in an upper side of the printed circuit board relative to the electrical wiring pattern, the upper side being formed with the optical transmission line groove.

3. The combined optical and electrical interconnection module according to claim 1, wherein
the printed circuit board further comprises an electrical connector at its opposite end face to its end face with the optical transmission line groove formed therein, the electrical connector being insertable into or removable from an electrical connector disposed in an external device.

4. The combined optical and electrical interconnection module according to claim 2, wherein
the printed circuit board further comprises an electrical connector at its opposite end face to its end face with the optical transmission line groove formed therein, the electrical connector being insertable into or removable from an electrical connector disposed in an external device.

5. The combined optical and electrical interconnection module according to claim 1, wherein
the optical waveguide is disposed in the middle in the width direction thereof,
the optical transmission line disposed in the middle in the width direction thereof, and
the electrical wiring wire is disposed on both sides of the printed circuit board and the flat cable.

6. The combined optical and electrical interconnection module according to claim 2, wherein
the optical block is disposed in the middle in the width direction thereof,
the optical transmission line is disposed in the middle in the width direction thereof, and
the electrical wiring wire is disposed on both sides of the printed circuit board and the flat cable.

7. A combined optical and electrical interconnection module, comprising:
a flat cable comprising an optical transmission line and an electrical wire; and
a printed circuit board comprising a light receiving module for receiving optical signals and/or a light sending module for sending optical signals, and an optical waveguide for the optical signals to be transmitted therethrough,
wherein the printed circuit board is electrically and optically connected to both ends or one end of the flat cable,
the printed circuit board is not more than 5 cm in length, and
the optical transmission line of the flat cable is not less than 20 cm in length.

8. A combined optical and electrical interconnection module, comprising:
a flat cable comprising an optical transmission line and an electrical wire; and
a printed circuit board comprising a light receiving module for receiving optical signals and/or a light sending module for sending optical signals, and an optical block for bending the optical paths of the optical signals,
wherein the printed circuit board is electrically and optically connected to both ends or one end of the flat cable,
the printed circuit board is not more than 5 cm in length, and
the optical transmission line of the flat cable is not less than 20 cm in length.

9. A method for producing a combined optical and electrical interconnection module, comprising:
arranging a plurality of optical transmission lines in its middle, and a plurality of electrical wires on both sides of the plural optical transmission lines;
pressure bonding thereto two coverings formed with openings having a specified gap therebetween, in such a manner as to sandwich upper and lower surfaces of the optical transmission lines and the electrical wires between the two coverings, to produce a flat cable;
removing portions of the optical transmission lines and the electrical wires in the openings in the flat cable formed with the openings having the specified gap therebetween;
removing the coverings on the optical transmission lines and the electrical wires in the openings in the flat cable to bare the optical transmission lines and the electrical wires to protrude from end faces of the flat cable;
structuring a printed circuit board, the printed circuit board having electrical wiring layers laminated with an insulating layer therebetween, the laminated electrical wiring layers being electrically connected with each other through a through hole, a surface of one of the electrical wiring layers being formed with an optical waveguide layer for optical signals to be transmitted therethrough;
forming in a portion of the optical waveguide a reflective portion for bending the optical paths of the optical signals, and mounting, on a surface of an other of the electrical wiring layers above the reflective portion, a light receiving module for receiving optical signals and/or a light sending module for sending optical signals;
forming optical transmission line grooves in the printed circuit board, to be engaged onto the optical transmission lines respectively protruding from the flat cable, and thereby connected and fixed thereto with an optical adhesive, to optically connect the light receiving module and/or the light sending module and the optical transmission lines;
forming an electrical connector at an opposite end face of the printed circuit board to its end face with the optical transmission line grooves formed therein;
forming, in the printed circuit board, electrical wiring grooves and electrical wiring patterns therein, to regulate the electrical wires of the flat cable to be positioned into the electrical wiring grooves, and thereby electrically connected and fixed to the electrical wiring patterns, respectively, with solder or a conductive adhesive;
after the joining of the flat cable and the printed circuit board, covering the printed circuit board and a portion of the flat cable with a protective member; and
cutting the printed circuit board between the light receiving module or the light sending module and the light sending module or the light receiving module.

* * * * *